(12) United States Patent
Kobayashi et al.

(10) Patent No.: US 9,454,923 B2
(45) Date of Patent: Sep. 27, 2016

(54) SEMICONDUCTOR DEVICE (71) Applicant: SEMICONDUCTOR ENERGY LABORATORY CO., LTD., Atsugi-shi, Kanagawa-ken (JP)

(72) Inventors: Hidetomo Kobayashi, Kanagawa (JP); Kiyoshi Kato, Kanagawa (JP); Wataru Uesugi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 25 days.

(21) Appl. No.: 14/277,248

(22) Filed: May 14, 2014

(65) Prior Publication Data

US 2014/0340127 A1    Nov. 20, 2014

(30) Foreign Application Priority Data

May 17, 2013    (JP) .................. 2013-104808

(51) Int. Cl.
| | |
|---|---|
| *H03K 17/687* | (2006.01) |
| *G09G 3/00* | (2006.01) |
| *H03K 19/00* | (2006.01) |
| *H01L 27/06* | (2006.01) |
| *H01L 27/12* | (2006.01) |
| *H01L 29/78* | (2006.01) |

(52) U.S. Cl.
CPC .............. *G09G 3/00* (2013.01); *H01L 27/0688* (2013.01); *H01L 27/1225* (2013.01); *H03K 19/0016* (2013.01); *G09G 2330/022* (2013.01); *H01L 29/7833* (2013.01)

(58) Field of Classification Search
CPC ............ H03K 17/063; H03K 17/0822; H03K 17/687; H03K 17/693
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Sibin Chen
(74) *Attorney, Agent, or Firm* — Fish & Richardson P.C.

(57) ABSTRACT

A semiconductor device with short overhead time. The semiconductor device includes a first wiring supplied with a power supply potential, a second wiring, a switch for controlling electrical connection between the first wiring and the second wiring, a load electrically connected to the second wiring, a transistor whose source and drain are electrically connected to the second wiring, and a power management unit having functions of controlling the conduction state of the switch and controlling a gate potential of the transistor. A channel formation region of the transistor is included in an oxide semiconductor film.

22 Claims, 4 Drawing Sheets

(56) References Cited

U.S. PATENT DOCUMENTS

| | | | |
|---|---|---|---|
| 6,563,174 B2 | 5/2003 | Kawasaki et al. | |
| 6,677,676 B1 * | 1/2004 | Wada | H01L 21/743 257/347 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,477,083 B2 | 1/2009 | Fujisawa et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,046,615 B2 | 10/2011 | Taguchi et al. | |
| 8,253,135 B2 | 8/2012 | Uochi et al. | |
| 8,351,226 B2 | 1/2013 | Osada | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0238236 A1 * | 10/2006 | Terayama | G11C 7/1078 327/544 |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0260756 A1 * | 10/2011 | Agut | 327/81 |
| 2011/0267297 A1 * | 11/2011 | Yamazaki et al. | 345/173 |
| 2012/0032730 A1 * | 2/2012 | Koyama | G11C 8/04 327/530 |
| 2012/0274361 A1 | 11/2012 | Miyake | |
| 2012/0305914 A1 | 12/2012 | Uochi et al. | |
| 2013/0235689 A1 | 9/2013 | Koyama | |
| 2013/0288426 A1 * | 10/2013 | Akimoto | H01L 29/66765 438/104 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-116851 A | 5/2009 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors ", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographi, 2005, vol. 220, pp. 567-570.

(56) References Cited

OTHER PUBLICATIONS

Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A) May 1, 1984, vol. 29, No. 5, pp. 2957-2959.
Dembo.H et al., "RFCPUS on Glass and Plastic Substrates Fabricated by TFT Transfer Technology ", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs ", Journal of the SID, 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc—Oxide TFTs Array", SID Digest '08 : SID International Symposium Digest of Technical Papers, May 20, 2008, vol. 39, No. 1 pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adc. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and SC2O3—A2O3—Bo Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.T et al., "UHF RFCPUS on Flexible and Glass Substrates for Secure RFID Systems", Journal of Solid-States Circuits , 2008, vol. 43, No. 1, pp. 292-299.
Lany.S et al., "Dopability, Instrinsic Conductivity, and Nonstoichiometry of Transparent Conducting Oxides", Phys. Rev. Lett. (Physical Review Letters), Jan. 26, 2007, vol. 98. pp. 045501-1-045501-4.
Lee.H et al., "Current Status of, Challenges to, and Perspective View of AM-OLED", IDW '06 : Proceeding of the 13th International Display Workshops, Dec. 7, 2006, pp. 663-666.
Lee.J et al., "World's Largest (15-Inch) XGA AMLCD Panel using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Interger) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaki.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshop, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure ", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.

(56) References Cited

OTHER PUBLICATIONS

Nowatari.H et al., "60.2: Intermediate Connector with Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display using In—Ga—Zn—Oxide TFTs with a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanizm of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT"SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Appied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39. pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedigs of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Anylsis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Wang.Y et al., "A 3us Wake-up Time Nonvolatile Processor Based on Ferroelectric Flip-Flops", ESSCIRC, 2012 Proceedings of the, Sep. 17, 2012, pp. 149-152.

\* cited by examiner

SEMICONDUCTOR DEVICE

BACKGROUND OF THE INVENTION

1. Field of the Invention

The present invention relates to a semiconductor device.

2. Description of the Related Art

In recent years, a technology for reducing power consumption of a semiconductor device such as a microcomputer has been developed, and attention has been focused on power gating that is a technology to stop application of power supply voltage to power domains in a central processing unit (CPU), memory, and the like when power supply is not necessary. Patent Document 1 discloses a microcomputer in which application of power supply voltage to a CPU and memory can be stopped.

REFERENCE

Patent Document 1: Japanese Published Patent Application No. 2009-116851

SUMMARY OF THE INVENTION

During power gating in a semiconductor device, the time from restart of power supply to start of normal operation of a power domain, that is, the overhead time is preferably as short as possible to operate a variety of electronic devices including the semiconductor device at high speed. Moreover, with a shorter overhead time, power gating with finer time granularity can be implemented.

In view of the foregoing technical background, an object of one embodiment of the present invention is to provide a semiconductor device with short overhead time.

In a semiconductor device of one embodiment of the present invention, a field-effect transistor (FET) whose source and drain are connected to each other is used as a capacitor connected to a wiring for supplying a power supply potential to a load. By controlling the gate potential of the FET (hereinafter simply referred to as transistor), the capacitance of the transistor functioning as the capacitor is varied between when power supply to the load is restarted and when the load operates normally.

Specifically, when power supply to the load is restarted, the capacitance of the transistor is reduced by making the potential of the gate lower than those of the source and drain. After the load starts to operate normally, the capacitance of the transistor is increased by making the potential of the gate higher than those of the source and drain.

With the above structure, when power supply to the load is restarted, the capacitance of the wiring that supplies the power supply potential to the load can be reduced, and a period for raising the potential of the wiring can be shortened. Normal operation of the load is started by using the potential of the wiring that is raised in a short time, thereby shortening the overhead time. Further, the increase in the capacitance of the wiring that supplies the power supply potential to the load prevents a change in the potential of the wiring due to voltage drop caused when current flows through the load. Thus, stable operation of the load can be achieved.

In one embodiment of the present invention, the transistor has a channel formation region in a film of a semiconductor that has a wider band gap and lower intrinsic carrier density than silicon, for example, an oxide semiconductor film. In the transistor having such a structure, the amount of charge accumulated in the channel formation region when the transistor operates in the cutoff region is much smaller than that of a transistor having a channel formation region in a silicon film. Consequently, the capacitance of the transistor having the above structure can be made closer to 0 when the potential of the gate is made approximately the same as those of the source and drain. Accordingly, by using the transistor having the above structure as a capacitor, the time it takes to charge the transistor when power supply to the load is restarted can be further shortened.

A semiconductor device of one embodiment of the present invention includes a first wiring supplied with a power supply potential, a second wiring, a switch for controlling electrical connection between the first wiring and the second wiring, a load electrically connected to the second wiring, a transistor whose source and drain are electrically connected to the second wiring, and a power management unit having functions of controlling the conduction state of the switch and controlling the potential of a gate of the transistor.

According to one embodiment of the present invention, a semiconductor device with short overhead time can be provided.

BRIEF DESCRIPTION OF THE DRAWINGS

In the accompanying drawings.

DETAILED DESCRIPTION OF THE INVENTION

Embodiments of the present invention will be described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

The present invention includes, in its category, semiconductor devices capable of implementing power gating, such as integrated circuits such as microprocessors, image processing circuits, digital signal processors (DSPs), and microcontrollers, RF tags, and semiconductor display devices. The semiconductor display devices include the following in the category: liquid crystal display devices, light-emitting devices in which a light-emitting element typified by an organic light-emitting diode (OLED) is provided for each pixel, electronic paper, digital micromirror devices (DMDs), plasma display panels (PDPs), field emission displays (FEDs), and other semiconductor display devices.

Embodiment 1

In Embodiment 1, a semiconductor device of one embodiment of the disclosed invention will be described with reference to a block diagram and a timing chart of FIGS. 1 and 2.

Note that a semiconductor device refers to a device including a semiconductor element. The semiconductor device also includes a driver circuit for driving a circuit including a semiconductor element, for example.

Figure 1:
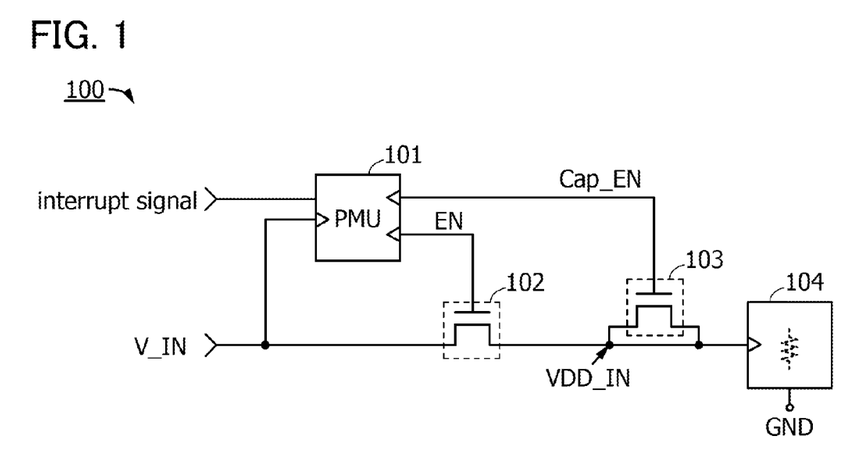
FIG. 1 is a block diagram of a semiconductor device.

FIG. 1 is a block diagram illustrating an example of a semiconductor device 100.

FIG. 1 illustrates the semiconductor device 100 including a power management unit (PMU) 101, a transistor 102, a transistor 103, and a load 104.

The power management unit 101 has a function of outputting a control signal EN supplied to the transistor 102 and a capacitance control signal Cap_EN supplied to the transistor 103 in accordance with an interrupt signal.

The power management unit 101 can control intermittent supply of power supply voltage to the load 104. When application of the power supply voltage to the load 104 is restarted, the power management unit 101 outputs the control signal EN for turning on the transistor 102 and the capacitance control signal Cap_EN for reducing the capacitance of the transistor 103. After application of the power supply voltage to the load 104 is restarted, the power management unit 101 outputs the capacitance control signal Cap_EN for increasing the capacitance of the transistor 103 while outputting the control signal EN for keeping the transistor 102 on.

The transistor 102 functions as a switch for supplying a reference potential VDD applied from a terminal V_IN from a wiring connected to one of a source and a drain (a first wiring) to a wiring connected to the other of the source and the drain (a second wiring). A gate of the transistor 102 is supplied with the control signal EN. The on/off state of the transistor 102 is controlled by the control signal EN.

In FIG. 1, a node on the second wiring side is represented as a node VDD_IN. The potential of the node VDD_IN is a potential supplied to the load 104.

Note that the transistor 102 is an element for making the potential on the second wiring side constant by current flowing from the first wiring to the second wiring. For this reason, the transistor 102 is preferably a transistor through which a large amount of current can flow, for example, a transistor using silicon for a semiconductor film.

The transistor 102 is an n-channel transistor in the following description; however, the transistor 102 may be a p-channel transistor as well. The n-channel transistor 102 is on when the control signal EN is at H level and is off when the control signal EN is at L level.

The transistor 103 functions as a variable capacitor or a metal oxide semiconductor (MOS) capacitor. A gate of the transistor 103 is supplied with the capacitance control signal Cap_EN. The transistor 103 can change a capacitance of the node VDD_IN in accordance with the capacitance control signal Cap_EN.

The capacitance of the transistor 103 is changed in accordance with a change in a potential applied to the gate. Accordingly, the transistor 103 is preferably a transistor whose capacitance can be changed significantly with a little change in a potential applied to the gate, for example, a transistor using an oxide semiconductor for a semiconductor film.

Although the transistor 103 is an n-channel transistor in the following description, the transistor 103 may alternatively be a p-channel transistor. In the case of the n-channel transistor 103, when the capacitance control signal Cap_EN is at H level, charge is accumulated in the semiconductor film and the capacitance is increased as a result; whereas when the capacitance control signal Cap_EN is at L level, charge is not accumulated in the semiconductor film and the capacitance is decreased.

The load 104 is an element or a circuit that operates in accordance with the power supply voltage based on the potential of the node VDD_IN and a potential GND.

In the semiconductor device 100 described in this embodiment, when application of the power supply voltage to the load 104 is restarted, the capacitance of the transistor 103 is decreased by making the potential of the gate of the transistor 103 lower than those of a source and a drain of the transistor 103. In addition, in the semiconductor device 100 in this embodiment, after the load 104 starts to operate normally, the capacitance of the transistor 103 is increased by making the potential of the gate of the transistor 103 higher than those of the source and drain of the transistor 103.

Note that power supply to the load 104 is restarted by switching the transistor 102 from the off state to the on state. Thus, in the semiconductor device 100, the capacitance of the second wiring can be decreased at the point in time when the reference potential VDD is supplied from the first wiring to the second wiring.

With the above structure, when power supply to the load is restarted, the capacitance of the wiring that supplies the power supply potential to the load can be reduced, and a period for raising the potential of the wiring can be shortened. Normal operation of the load is started by using the potential of the wiring that is raised in a short time, thereby shortening the overhead time. Further, the increase in the capacitance of the wiring that supplies the power supply potential to the load prevents a change in the potential of the wiring due to voltage drop caused when current flows through the load. Thus, stable operation of the load can be achieved.

The transistor 103 described in this embodiment has a structure in which a channel formation region is included in a film of a semiconductor that has a wider band gap and lower intrinsic carrier density than silicon, for example, an oxide semiconductor film.

In the transistor having such a structure, the amount of charge accumulated in the channel formation region when the transistor operates in the cutoff region is much smaller than that of a transistor having a channel formation region in a silicon film. Consequently, the capacitance of the transistor having the above structure can be made closer to 0 when the potential of the gate is made approximately the same as those of the source and drain. Accordingly, by using the transistor having the above structure as a capacitor, the time it takes to charge the transistor when power supply to the load is restarted can be further shortened.

Next, the operation of the semiconductor device 100 will be described using a timing chart in FIG. 2.

Figure 2:
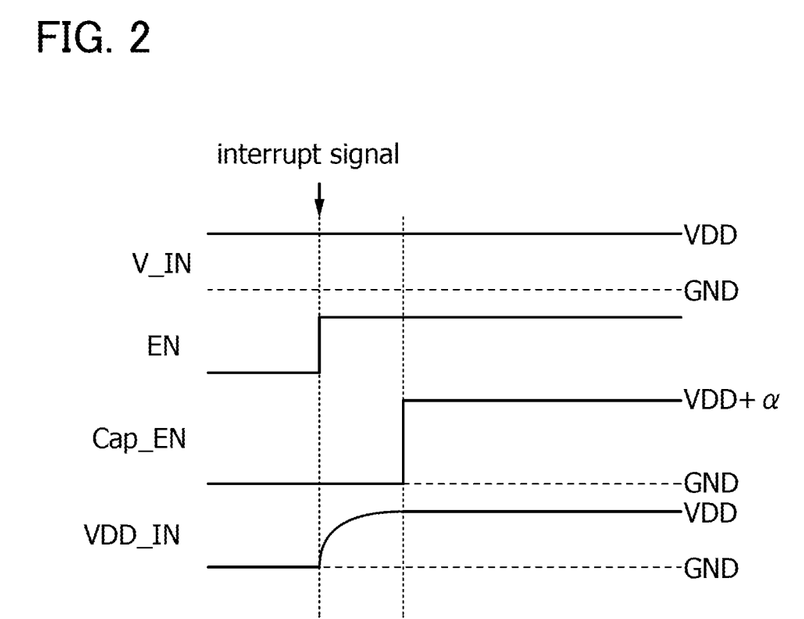
FIG. 2 is a timing chart illustrating the operation of a semiconductor device.

FIG. 2 shows changes in a potential or a signal of the terminal V_IN, the control signal EN, the capacitance control signal Cap_EN, and the node VDD_IN in FIG. 1.

First, when an interrupt signal is supplied to the power management unit 101, the control signal EN becomes H level, so that the transistor 102 is turned on. Thus, the potential of the node VDD_IN increases from the potential GND to the potential VDD (>GND). At this time, the capacitance control signal Cap_EN supplied to the transistor 103 is at L level; in other words, the capacitance of the transistor 103 is small and the capacitance of the second wiring is small. Accordingly, the potential of the node VDD_IN can rise steeply, that is, the potential can increase from the potential GND to the potential VDD in a short time.

After the potential of the node VDD_IN rises, the power management unit 101 switches the capacitance control signal Cap_EN to H level while keeping the control signal EN at H level. At this time, the H-level potential of the capacitance control signal Cap_EN is preferably a potential higher than the potential VDD (i.e., VDD+α, where α is larger than 0), in which case the capacitance of the transistor 103 can be increased more reliably.

With the structure described above in this embodiment, the potential of the wiring that supplies the power supply voltage to the load can be increased in a short time, whereby the overhead time can be shortened.

The structure described above in this embodiment can be combined as appropriate with any of the structures described in the other embodiments.

Embodiment 2

A highly purified oxide semiconductor (purified oxide semiconductor) obtained by reduction of impurities such as moisture or hydrogen serving as electron donors (donors) and reduction of oxygen vacancies is an intrinsic (i-type) semiconductor or a substantially i-type semiconductor. For this reason, a transistor having a channel formation region in a highly purified oxide semiconductor film has extremely low off-state current and high reliability.

Specifically, various experiments can prove a low off-state current of a transistor having a channel formation region in a highly purified oxide semiconductor film. For example, the off-state current of even an element having a channel width of $1 \times 10^6$ μm and a channel length of 10 μm can be less than or equal to the measurement limit of a semiconductor parameter analyzer, that is, less than or equal to $1 \times 10^{-13}$ A at a voltage between source and drain electrodes (a drain voltage) of 1 V to 10 V. In this case, it can be seen that off-state current standardized on the channel width of the transistor is lower than or equal to 100 zA/μm. In addition, the off-state current is measured using a circuit in which a capacitor and a transistor are connected to each other and charge flowing into or from the capacitor is controlled by the transistor. In the measurement, a highly purified oxide semiconductor film is used for a channel formation region of the transistor, and the off-state current of the transistor is measured from a change in the amount of charge of the capacitor per unit time. As a result, it is found that when the voltage between the source and the drain electrodes of the transistor is 3 V, a lower off-state current of several tens of yoctoamperes per micrometer (yA/μm) is obtained. Consequently, the transistor in which a highly purified oxide semiconductor film is used for a channel formation region has much lower off-state current than a transistor including crystalline silicon.

When an oxide semiconductor film is used as the semiconductor film, the oxide semiconductor preferably contains at least indium (In) or zinc (Zn). Further, as a stabilizer for reducing variations in electric characteristics of transistors using the oxide semiconductor, the oxide semiconductor preferably contains gallium (Ga), tin (Sn), hafnium (Hf), aluminum (Al), and/or zirconium (Zr) in addition to indium (In) and/or zinc (Zn).

In—Ga—Zn-based oxide and In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Further, unlike in the case of using silicon carbide, gallium nitride, or gallium oxide, with the use of the In—Ga—Zn-based oxide, transistors with excellent electrical characteristics can be formed over a glass substrate, and a larger substrate can be used.

As another stabilizer, the oxide semiconductor may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Ce—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide refers to an oxide containing In, Ga, and Zn, and there is no limitation on the ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Moreover, the In—Ga—Zn-based oxide has high mobility.

For example, high mobility can be obtained relatively easily with an In—Sn—Zn-based oxide. However, even with an In—Ga—Zn-based oxide, the mobility can be increased by reduction in the defect density in a bulk.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region and which is entirely amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "perpendicular" indicates that the angle formed between two straight lines is greater than or equal to $80°$ and less than or equal to $100°$, and accordingly includes the case where the angle is greater than or equal to $85°$ and less than or equal to $95°$.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around $31°$. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around $56°$. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around $56°$. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around $56°$.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Further, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. Moreover, when an impurity is added to the CAAC-OS film, the crystallinity in a region to which the impurity is added is changed, and the crystallinity in the CAAC-OS film may vary depending on regions.

When the CAAC-OS film with an $InGaZnO_4$ crystal is analyzed by an out-of-plane method, a peak of $2\theta$ may also be observed at around $36°$, in addition to the peak of $2\theta$ at around $31°$. The peak of $2\theta$ at around $36°$ indicates that a crystal having no c-axis alignment is included in part of the CAAC-OS film. It is preferable that in the CAAC-OS film, a peak of $2\theta$ appears at around $31°$ and a peak of $2\theta$ do not appear at around $36°$.

In a transistor including the CAAC-OS film, a change in electrical characteristics due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

The CAAC-OS film is preferably deposited under the following conditions.

Decay of the crystal state due to impurities can be prevented by reducing the amount of impurities entering the CAAC-OS film during the deposition, for example, by reducing the concentration of impurities (e.g., hydrogen, water, carbon dioxide, and nitrogen) that exist in a treatment chamber or by reducing the concentration of impurities in a deposition gas. Specifically, a deposition gas with a dew point of $-80°$ C. or lower, preferably $-100°$ C. or lower is used.

By increasing the substrate heating temperature during the deposition, migration of a sputtered particle is likely to occur after the sputtered particle reaches a substrate surface. Specifically, the substrate temperature during the deposition ranges from $100°$ C. to $740°$ C., preferably from $200°$ C. to $500°$ C. When the substrate heating temperature during the deposition is increased and flat-plate-like or pellet-like sputtered particles reach the substrate, migration occurs on the substrate, so that a flat plane of each sputtered particle is attached to the substrate.

It is preferable that the proportion of oxygen in the deposition gas be increased and the power be optimized in order to reduce plasma damage in the deposition. The proportion of oxygen in the deposition gas is 30 vol % or higher, preferably 100 vol %.

As an example of a target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature of 1000° C. to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder can be determined as appropriate depending on the desired target.

Alkali metal is not an element included in an oxide semiconductor and thus is an impurity. Likewise, alkaline earth metal is an impurity when the alkaline earth metal is not a component of the oxide semiconductor. When an insulating film in contact with an oxide semiconductor layer is an oxide, Na, among the alkali metals, diffuses into the insulating film and becomes $Na^+$. Further, in the oxide semiconductor film, Na cuts or enters a bond between metal and oxygen which are components of the oxide semiconductor. As a result, the electrical characteristics of the transistor deteriorate, for example, the transistor is placed in a normally-on state because of a negative shift of the threshold voltage or the mobility is decreased. In addition, the characteristics of transistors vary. Specifically, the Na concentration measured by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measured Li concentration is preferably $5 \times 10^{15}/cm^3$ or lower, further preferably $1 \times 10^{15}/cm^3$ or lower. Similarly, the measured K concentration is preferably $5 \times 10^{15}/cm^3$ or lower, further preferably $1 \times 10^{15}/cm^3$ or lower.

In the case where metal oxide containing indium is used, silicon or carbon having higher bond energy with oxygen than indium might cut the bond between indium and oxygen, so that an oxygen vacancy may be formed. Accordingly, when silicon or carbon is contained in the oxide semiconductor film, the electric characteristics of the transistor are likely to deteriorate as in the case of using alkali metal or alkaline earth metal. Thus, the concentrations of silicon and carbon in the oxide semiconductor film are preferably low. Specifically, the C concentration or the Si concentration measured by secondary ion mass spectrometry is preferably less than or equal to $1 \times 10^{18}/cm^3$. In this case, the deterioration of the electric characteristics of the transistor can be prevented, so that the reliability of a semiconductor device can be improved.

A metal in the source and drain electrodes might extract oxygen from the oxide semiconductor film depending on a conductive material used for the source and drain electrodes. In such a case, regions of the oxide semiconductor film in contact with the source and drain electrodes become n-type regions because of the formation of an oxygen vacancy.

The n-type regions serves as source and drain regions, resulting in a decrease in the contact resistance between the oxide semiconductor film and the source electrode or the drain electrode. Accordingly, the formation of the n-type regions increases the mobility and on-state current of the transistor, which achieves high-speed operation of a switch circuit using the transistor.

Note that the extraction of oxygen by a metal in the source and drain electrodes is probably caused when the source and drain electrodes are formed by sputtering or when heat treatment is performed after the formation of the source and drain electrodes.

The n-type regions are more likely to be formed when the source and drain electrodes are formed using a conductive material that is easily bonded to oxygen. Examples of such a conductive material include Al, Cr, Cu, Ta, Ti, Mo, and W.

The oxide semiconductor film is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film that contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film whose lowest conduction band energy is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, resulting in an increase in the field-effect mobility of the transistor.

If an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure can reduce variations in the electrical characteristics of the transistor, such as the threshold voltage.

Further, a plurality of metal oxide films are preferably stacked so that an interface level that inhibits carrier flow is not formed at the interface between the metal oxide films due to an impurity existing between the metal oxide films. This is because if an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, particularly a U-shape well structure whose lowest conduction band energy is changed continuously between the films) is formed more easily than the case of merely stacking a plurality of metal oxide films that contain at least one common metal as a main component.

In order to form such a continuous energy band, the films need to be stacked successively without being exposed to the air by using a multi-chamber deposition system (sputtering system) provided with a load lock chamber. Each chamber of the sputtering apparatus is preferably evacuated to a high vacuum (to about $5 \times 10^{-7}$ Pa to $1 \times 10^{-4}$ Pa) by an adsorption vacuum pump such as a cryopump so that water and the like acting as impurities for the oxide semiconductor are removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the sputtering gas has a dew point of −40° C. or lower, preferably −80° C. or lower, further preferably −100° C. or lower and is highly purified, moisture and the like can be prevented from entering the oxide semiconductor film as much as possible. Specifically, when the second metal oxide film is an In-M-Zn oxide film (M is Ga, Y, Zr, La, Ce, or Nd) and a target having an atomic ratio of metal elements of In:M:Zn=$x_1$:$y_1$:$z_1$ is used to form the second metal oxide film, $x_1/y_1$ ranges preferably from ⅓ to 6, further preferably from 1 to 6, and $z_1/y_1$ ranges preferably from ⅓ to 6, further preferably from 1 to 6. Note that when $z_1/y_1$ ranges from 1 to 6, a CAAC-OS film is likely to be formed as the second metal oxide film. Typical examples of the atomic ratio of In to M and Zn in the target are 1:1:1 and 3:1:2.

Specifically, when the first and third metal oxide films are each an In-M-Zn oxide film (M is Ga, Y, Zr, La, Ce, or Nd) and a target used for depositing the first and third metal oxide films has an atomic ratio of metal elements of In:M:Zn=$x_2$:$y_2$:$z_2$, $x_2/y_2 < x_1/y_1$ is satisfied and $z_2/y_2$ ranges preferably from ⅓ to 6, further preferably from 1 to 6. Note that when $z_2/y_2$ ranges from 1 to 6, CAAC-OS films are likely to be formed as the first and third metal oxide films Typical examples of the atomic ratio of In to M and Zn in the target are 1:3:2, 1:3:4, 1:3:6, and 1:3:8.

The first and third metal oxide films each have a thickness of 3 nm to 100 nm, preferably 3 nm to 50 nm. The second metal oxide film has a thickness of 3 nm to 200 nm, preferably 3 nm to 100 nm, further preferably 3 nm to 50 nm.

In the three-layer semiconductor film, each of the first to third metal oxide films can be amorphous or crystalline. Note that the second metal oxide film in which a channel region is formed is preferably crystalline, in which case the transistor can have stable electrical characteristics.

Note that a channel formation region refers to a region of a semiconductor film of a transistor that overlaps with a gate electrode and is located between a source electrode and a drain electrode. Further, a channel region refers to a region through which current mainly flows in the channel formation region.

For example, when an In—Ga—Zn-based oxide film formed by sputtering is used as each of the first and third metal oxide films, the first and third metal oxide films can be deposited with use of an In—Ga—Zn-based oxide target containing In, Ga, and Zn at an atomic ratio of 1:3:2. The deposition conditions can be as follows, for example: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Further, when the second metal oxide film is a CAAC-OS film, the second metal oxide film is preferably deposited with use of a polycrystalline In—Ga—Zn-based oxide target containing In, Ga, and Zn at an atomic ratio of 1:1:1. The deposition conditions can be as follows, for example: an argon gas (flow rate: 30 sccm) and an oxygen gas (flow rate: 15 sccm) are used as the deposition gas; the pressure is 0.4 Pa; the substrate temperature is 300° C.; and the DC power is 0.5 kW.

Note that the edge portion of the semiconductor film included in the transistor may be inclined or may be rounded.

Also in the case where a semiconductor film including stacked metal oxide films is used in the transistor, a region in contact with the source electrode or the drain electrode can be an n-type region. Such a structure increases the mobility and on-state current of the transistor and achieves high-speed operation of a semiconductor device using the transistor. Further, when the semiconductor film including the stacked metal oxide films is used in the transistor, the n-type region particularly preferably reaches the second metal oxide film part of which is to be a channel region, because the mobility and on-state current of the transistor are further increased and higher-speed operation of the semiconductor device is achieved.

Embodiment 3

Figure 3:
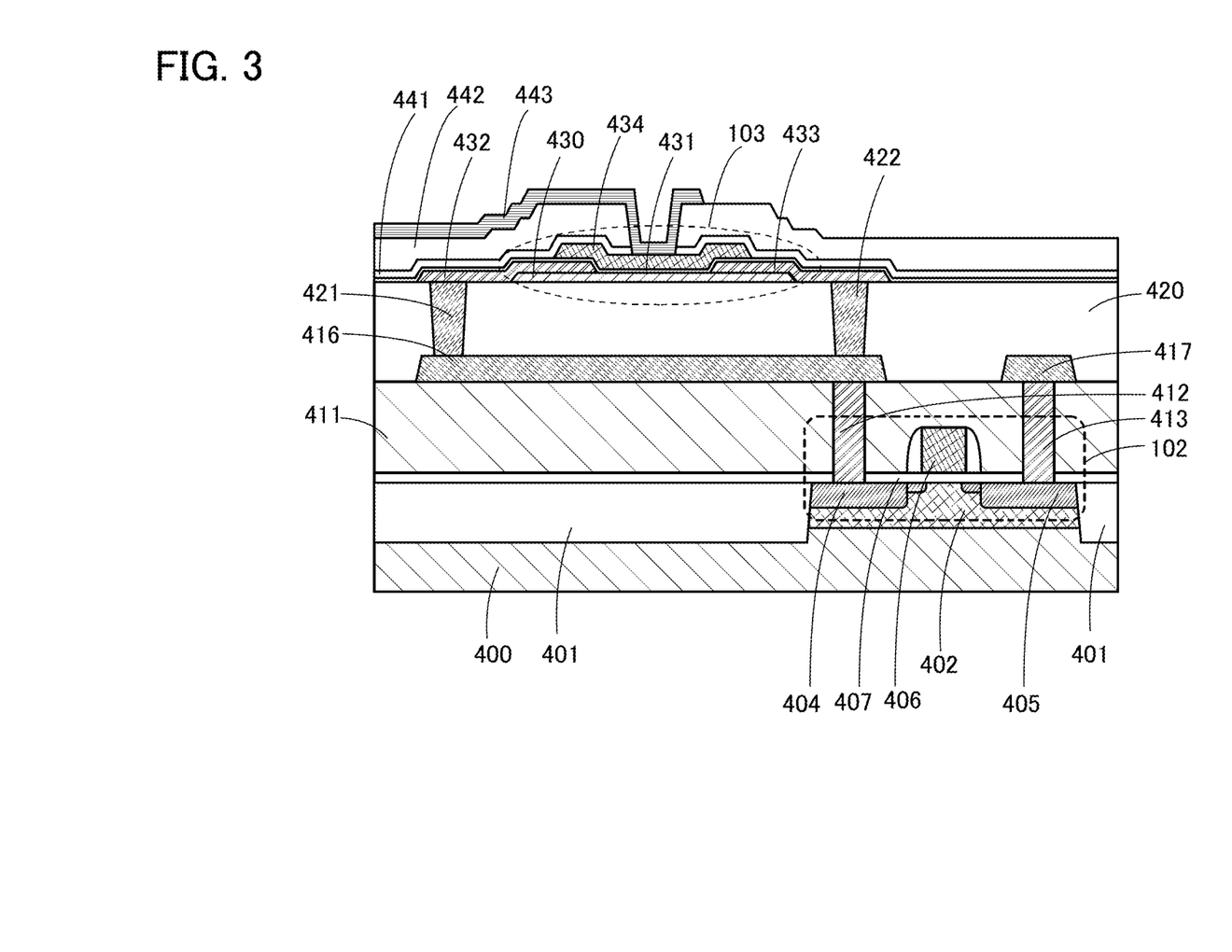
FIG. 3 illustrates a cross-sectional structure of a semiconductor device.

FIG. 3 illustrates an example of a cross-sectional structure of the transistor 102 and the transistor 103 included in the semiconductor device 100 illustrated in FIG. 1.

Note that FIG. 3 illustrates an example where the transistor 103 including a channel formation region in an oxide semiconductor film is formed over the transistor 102 including a channel formation region in a single crystal silicon substrate.

The transistor 102 may include a channel formation region in a semiconductor film or a semiconductor substrate of silicon, germanium, or the like in an amorphous, microcrystalline, polycrystalline, or single crystal state. Alternatively, the transistor 102 may include a channel formation region in an oxide semiconductor film or an oxide semiconductor substrate. In the case where channel formation regions of all the transistors are included in an oxide semiconductor film or an oxide semiconductor substrate, the transistor 103 is not necessarily stacked over the transistor 102, and the transistors 102 and 103 may be formed in the same layer.

In the case where the transistor 102 is formed using a thin silicon film, the thin film can be formed using any of the following, for example: amorphous silicon formed by sputtering or vapor phase growth such as plasma-enhanced CVD; polycrystalline silicon obtained by crystallization of amorphous silicon by laser annealing or the like; and single crystal silicon obtained by separation of a surface portion of a single crystal silicon wafer by implantation of hydrogen ions or the like into the silicon wafer.

A semiconductor substrate 400 where the transistor 102 is formed can be, for example, a silicon substrate, a germanium substrate, or a silicon germanium substrate. In FIG. 3, a single crystal silicon substrate is used as the semiconductor substrate 400.

The transistor 102 is electrically isolated by an element isolation method such as a local oxidation of silicon (LOCOS) method or a shallow trench isolation (STI) method. FIG. 3 illustrates the example where the transistor 102 is electrically isolated by STI. Specifically, in FIG. 3, the transistor 102 is isolated using element isolation regions 401 formed in such a manner that trenches are formed in the semiconductor substrate 400 by etching or the like and then filled with an insulator containing silicon oxide or the like.

In a region where the n-channel transistor 102 is formed between the element isolation regions 401, a p-well 402 into which an impurity element imparting p-type conductivity is selectively introduced is provided.

The transistor 102 includes impurity regions 404 and 405 that are formed in the p-well 402 and function as source and drain regions, a gate electrode 406, and a gate insulating film 407 provided between the semiconductor substrate 400 and the gate electrode 406. The gate electrode 406 overlaps a channel formation region formed between the impurity regions 404 and 405 with the gate insulating film 407 positioned between the gate electrode 406 and the channel formation region.

An insulating film 411 is provided over the transistor 102. Openings are formed in the insulating film 411. Conductive films 412 and 413 electrically connected to the impurity regions 404 and 405, respectively, are formed in the openings.

The conductive film 412 is electrically connected to a conductive film 416 formed over the insulating film 411. The conductive film 413 is electrically connected to a conductive film 417 formed over the insulating film 411.

An insulating film 420 is formed over the conductive films 416 and 417. Openings are formed in the insulating film 420. Conductive films 421 and 422 electrically connected to the conductive film 416 are formed in the openings.

In FIG. 3, the transistor 103 is formed over the insulating film 420.

The transistor 103 includes, over the insulating film 420, a semiconductor film 430 containing an oxide semiconductor, conductive films 432 and 433 that are positioned over the semiconductor film 430 and function as source and drain electrodes, a gate insulating film 431 over the semiconductor film 430 and the conductive films 432 and 433, and a gate electrode 434 that is positioned over the gate insulating film 431 and overlaps the semiconductor film 430 between the conductive films 432 and 433. Note that the conductive film 432 is electrically connected to the conductive film 421, and the conductive film 433 is electrically connected to the conductive film 422.

An insulating film 441 and an insulating film 442 are stacked in this order over the transistor 103. An opening is formed in the insulating films 441 and 442. A conductive film 443 that is in contact with the gate electrode 434 in the opening is provided over the insulating film 442.

In FIG. 3, the transistor 103 has a single-gate structure where one channel formation region corresponding to one gate electrode 434 is provided. Alternatively, the transistor 103 may have a multi-gate structure where a plurality of gate electrodes electrically connected to each other are provided and thus a plurality of channel formation regions are included in one active layer.

Embodiment 4

The semiconductor device of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable information appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), and vending machines. FIGS. 4A to 4F illustrate specific examples of such electronic devices.

Figure 4A:
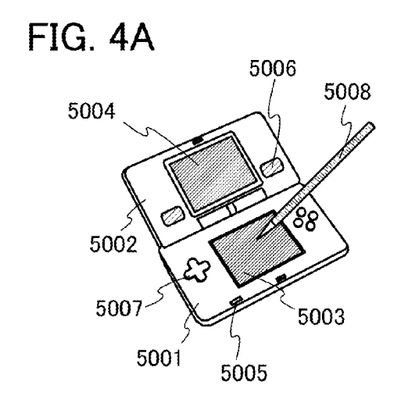
FIGS. 4A to 4F each illustrate an electronic device.

FIG. 4A illustrates a portable game console including a housing 5001, a housing 5002, a display portion 5003, a display portion 5004, a microphone 5005, speakers 5006, a control key 5007, a stylus 5008, and the like. Although the portable game console illustrated in FIG. 4A has the two display portions 5003 and 5004, the number of display portions included in a portable game console is not limited to this.

Figure 4B:
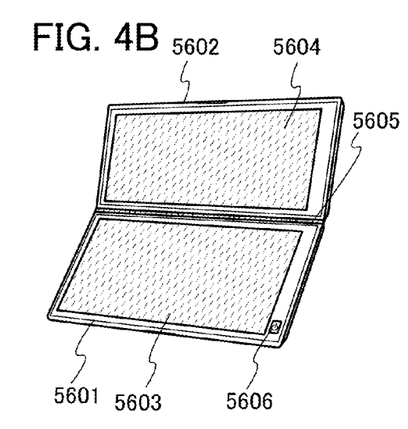

FIG. 4B illustrates a portable information appliance including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device or by providing a photoelectric conversion element called a photosensor in a pixel area of a display device.

Figure 4C:
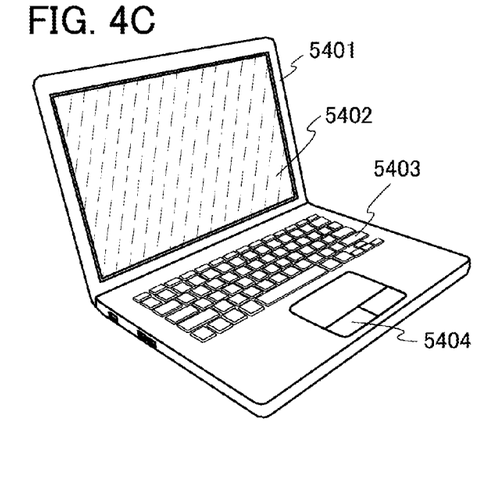

FIG. 4C illustrates a laptop including a housing 5401, a display portion 5402, a keyboard 5403, a pointing device 5404, and the like.

Figure 4D:
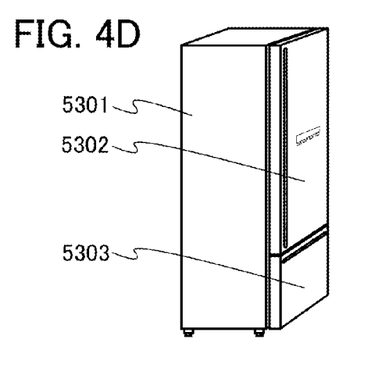

FIG. 4D illustrates an electric refrigerator-freezer including a housing 5301, a refrigerator door 5302, a freezer door 5303, and the like.

Figure 4E:
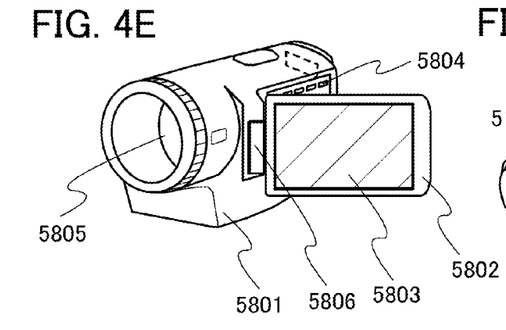

FIG. 4E illustrates a video camera including a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 4F:
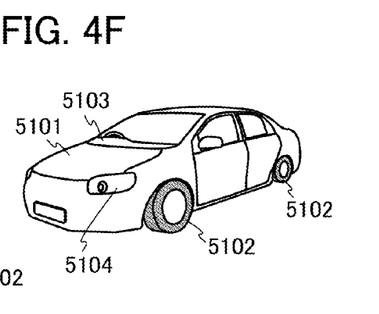

FIG. 4F illustrates a passenger car including a car body 5101, wheels 5102, a dashboard 5103, lights 5104, and the like.

This application is based on Japanese Patent Application serial no. 2013-104808 filed with Japan Patent Office on May 17, 2013, the entire contents of which are hereby incorporated by reference.

What is claimed is:

1. A semiconductor device comprising:
a first wiring supplied with a power supply potential;
a second wiring;
a switch configured to control electrical connection between the first wiring and the second wiring;
a load electrically connected to the second wiring;
a conductive film electrically connected to the switch;
an insulating film over the conductive film;

a first transistor over the insulating film, the first transistor comprising:
a semiconductor film; and
a source and a drain electrically connected to the semiconductor film; and
a power management unit configured to control a conduction state of the switch and control a potential of a gate of the first transistor,
wherein the source and the drain of the first transistor are electrically connected to the conductive film, and
wherein the first transistor is configured to be a MOS capacitor.

2. The semiconductor device according to claim 1, wherein the first transistor comprises an oxide semiconductor in a channel formation region.

3. The semiconductor device according to claim 2, wherein the oxide semiconductor comprises In, Ga, and Zn.

4. The semiconductor device according to claim 2, wherein the oxide semiconductor comprises In and Zn.

5. The semiconductor device according to claim 2, wherein the oxide semiconductor comprises a crystal.

6. The semiconductor device according to claim 1, wherein the switch is a second transistor comprising silicon in a channel formation region.

7. The semiconductor device according to claim 6, wherein the first transistor is provided above the second transistor.

8. The semiconductor device according to claim 1, wherein the switch is a second transistor comprising an oxide semiconductor in a channel formation region.

9. The semiconductor device according to claim 8, wherein the first transistor and the second transistor are provided in the same layer.

10. The semiconductor device according to claim 1, wherein the power management unit is configured to output a first control signal to the switch and output a second control signal to the first transistor in accordance with an interrupt signal input to the power management unit.

11. The semiconductor device according to claim 1, the source and the drain of the first transistor are directly connected to the conductive film.

12. A semiconductor device comprising:
a first wiring supplied with a power supply potential;
a second wiring;
a switch electrically connected to the first wiring and the second wiring;
a load electrically connected to the second wiring;
a conductive film electrically connected to the switch;
an insulating film over the conductive film;
a first transistor over the insulating film, the first transistor comprising:
a semiconductor film; and
a source and a drain electrically connected to the semiconductor film; and
a power management unit electrically connected to the first wiring, the switch, and a gate of the first transistor,
wherein the source and the drain of the first transistor are electrically connected to the conductive film, and
wherein the first transistor is configured to be a MOS capacitor.

13. The semiconductor device according to claim 12, wherein the first transistor comprises an oxide semiconductor in a channel formation region.

14. The semiconductor device according to claim 13, wherein the oxide semiconductor comprises In, Ga, and Zn.

15. The semiconductor device according to claim 13, wherein the oxide semiconductor comprises In and Zn.

16. The semiconductor device according to claim 13, wherein the oxide semiconductor comprises a crystal.

17. The semiconductor device according to claim 12, wherein the switch is a second transistor comprising silicon in a channel formation region.

18. The semiconductor device according to claim 17, wherein the first transistor is provided above the second transistor.

19. The semiconductor device according to claim 12, wherein the switch is a second transistor comprising an oxide semiconductor in a channel formation region.

20. The semiconductor device according to claim 19, wherein the first transistor and the second transistor are provided in the same layer.

21. The semiconductor device according to claim 12, wherein the power management unit is configured to output a first control signal to the switch and output a second control signal to the first transistor in accordance with an interrupt signal input to the power management unit.

22. The semiconductor device according to claim 12, the source and the drain of the first transistor are directly connected to the conductive film.

* * * * *